United States Patent
Inadomaru et al.

(10) Patent No.: US 8,509,296 B2
(45) Date of Patent: Aug. 13, 2013

(54) SPECTRUM ANALYZER AND SPECTRUM ANALYSIS METHOD

(75) Inventors: Momoko Inadomaru, Atsugi (JP); Toru Otani, Atsugi (JP); Yuji Kishi, Atsugi (JP)

(73) Assignee: Anritsu Corporation, Atsugi-Shi (JP)

( * ) Notice: Subject to any disclaimer, the term of this patent is extended or adjusted under 35 U.S.C. 154(b) by 430 days.

(21) Appl. No.: 12/967,353

(22) Filed: Dec. 14, 2010

(65) Prior Publication Data
US 2011/0150062 A1 Jun. 23, 2011

(30) Foreign Application Priority Data
Dec. 17, 2009 (JP) .................................. 2009-286836

(51) Int. Cl.
*H04B 17/00* (2006.01)
*G01R 23/16* (2006.01)

(52) U.S. Cl.
USPC ........................................ 375/228; 324/76.22

(58) Field of Classification Search
USPC .................. 375/224, 228; 324/76.19, 76.22
See application file for complete search history.

(56) References Cited

U.S. PATENT DOCUMENTS

| 4,839,582 A * | 6/1989 | Fukaya et al. ............. 324/76.23 |
| 6,229,316 B1 * | 5/2001 | Fukui et al. .................... 324/624 |
| 2008/0231254 A1 * | 9/2008 | Kanoh et al. ............... 324/76.19 |

FOREIGN PATENT DOCUMENTS
JP 2008-111832 5/2008

* cited by examiner

*Primary Examiner* — Kevin M Burd
(74) *Attorney, Agent, or Firm* — Pearne & Gordon LLP

(57) ABSTRACT

There is provided a spectrum analyzer and a spectrum analysis method capable of promptly performing measurement while preventing the spectrum waveform caused by the fractional spurious components from being displayed.

When the width of a designated span (analysis target frequency range) is larger than a boundary value, a reference signal frequency is set to a predetermined reference value, and a loop filter band narrower than a RBW (resolution bandwidth) is selected to thereby make the fractional spurious components be within the RBW and prevent it from being displayed as a spectrum waveform. Further, when the width of the designated span is smaller than a boundary value, the reference signal frequency is shifted from the reference value by a predetermined value so as to increase the frequency differences between the fractional spurious components and the main signal component of a VCO output signal by an amount equal to the product between the shift amount and the integer part of the frequency division ratio, and the band of the loop filter is set in accordance with the region including the RBW in a range narrower than the increased frequency difference so as to suppress the levels of the fractional spurious components.

2 Claims, 4 Drawing Sheets

SPECTRUM ANALYZER AND SPECTRUM ANALYSIS METHOD

BACKGROUND

1. Technical Field

The present invention relates to a spectrum analyzer and a technique therefor. The spectrum analyzer generates a local signal, of which the frequency is swept, in a local signal generation section, inputs the local signal to a mixer together with an input signal, extracts a signal of a predetermined intermediate frequency band from the output from the mixer, detects the level of the extracted signal, and displays a spectrum waveform of a frequency component included in the input signal in a desired observation range. In addition, in the technique for the spectrum analyzer, the local signal generation section employs a PLL synthesizer (a fractional-N PLL synthesizer) configured to be able to minutely perform a frequency sweep by using a fractional frequency divider in a feedback loop between a VCO and a phase comparator, thereby preventing the unwanted waveform components caused by the spurious components of the PLL synthesizer from being displayed in measurement result.

2. Related Art

Generally, spectrum analyzers are used to detect an intensity of a signal component of an input signal included in a desired frequency range and display a waveform on a screen in which the horizontal axis represents the frequency and the vertical axis represents the intensity, and are thus configured as shown in FIG. 4.

That is, a local signal L subjected to a frequency sweep is generated by a local signal generation section 11, and is provided to a mixer 13 of a frequency conversion section 12 together with an input signal $S_{IN}$. Then, by inputting the output thereof to a filter 14, a signal component $S_{IF}$ of a predetermined intermediate frequency band is extracted.

Here, with respect to a center frequency $f_{IF}$ of the intermediate frequency band, when an upper heterodyne receiver of which a local frequency $f_L$ is high is used, the local frequency $f_L$ may be swept and changed from $f_{L1}$ to $f_{L2}$. In this case, a component with frequency ranging from $(f_{L1}\,f_{IF})$ to $(f_{L2}\text{-}f_{IF})$ among the components included in the input signal $S_{IN}$ is chronologically extracted. Then, the extracted signal $S_{IF}$ is input to a signal processing section 15, and an amplitude detection process and a band limiting process corresponding to a resolution bandwidth RBW are performed. By obtaining signal intensity data, that is, spectrum waveform data for every frequency and plotting the data in the frequency axis on the display section 16, it is possible to obtain a spectrum waveform with a frequency range of $(f_{L1}\text{-}f_{IF})$ to $(f_{L2}\text{-}f_{IF})$.

As described above, in the spectrum analyzers having a system that converts each frequency component of the input signal into the predetermined intermediate frequency band by using the local signal subjected to the frequency sweep, the frequency precision and reproducibility of the local signal is required. Hence, the PLL synthesizer is generally used.

As shown in FIG. 5, the PLL synthesizer divides the frequency of the output of a VCO (a voltage control oscillator) 11a by N through a frequency divider 11b, provides the output to a phase comparator 11c together with a reference signal R, and smoothes an error signal, which is output in response to the phase difference, through a loop filter 11d. Then, the PLL synthesizer provides the signal as a control signal (or a part thereof) to the VCO 11a, and performs feedback control so as to make the phase difference equal to 0 or a regular value ($\pi$, $\pi/2$, or the like), thereby locking an output frequency $f_{VCO}$ of the VCO 11a to a product $N \cdot f_R$ between a reference signal frequency $f_R$ and a frequency division ratio N of the frequency divider 11b.

When using the PLL synthesizer having such a configuration as the local signal generation section 11 of the spectrum analyzer, it is necessary to continuously vary the frequency of the VCO 11a in a prescribed step. However, even in the case of the spectrum analyzer of which the observation range is as high as several GHz, the required frequency resolution is equal to or less than several Hz, and it is necessary for the resolution of the local frequency to be equal to or less than that.

In order to achieve the above-mentioned conditions by using the PLL synthesizer with the above-mentioned structure, it is necessary for at least one of the reference signal frequency $f_R$ and the frequency division ratio N to be minutely varied so as to change the output frequency $f_{VCO}$ in a step where it is equal to, for example, about several MHz.

Here, regarding the response speed of the PLL, as the reference signal frequency is higher, the band of the loop filter 11d can be set to be larger, and thus it is possible to perform a fast frequency change. However, the band widens by that amount, and thus C/N at a far position deteriorates. In contrast, when the reference signal frequency is set to be low, the C/N at the far position improves, but it takes time to perform the frequency change.

Accordingly, in the PLL synthesizer for which the fast frequency change referred to as the frequency sweep is necessary, it is necessary to minutely change the output frequency without lowering the reference signal frequency.

Further, since the loop gain is changed in accordance with the frequency division ratio, it is not a good idea to drastically change the frequency division ratio.

In other words, it is preferable to sweep the output frequency by setting the reference signal frequency to a certain high frequency and minutely changing the frequency division ratio in a certain range.

In the general integer frequency dividers, it is difficult to perform the frequency division of a signal of several GHz in minute steps. However, recently, fractional frequency dividers have been implemented, and thus by using them, it is possible to perform the frequency division of minute steps.

The PLL synthesizer using the fractional frequency divider is called a fractional-N PLL synthesizer, and is able to perform the frequency division of the frequency division ratio (N+F) with respect to the integer N and the value F (normally F is a fraction value) of 0 or more and less than 1. In principle, the frequency division of the frequency division ratio N and the frequency division of the frequency division ratio N+1 are performed at a certain ratio therebetween within a set length of time so as to make the average frequency division ratio equal to N+F.

For example, when N=100 and F=0.1, the frequency is divided by 100 9 times (the number of input pulses is 900), and the frequency is divided by 101 once (the number of input pulses is 101), and thus pulses of a divided frequency 10 times relative to a total of 1001 input pulses are output. Consequently, the average frequency division ratio is 1001/10=100.1.

For example, by setting the minimum number of digits of the value F to $10^{-6}$ or the like through the fractional frequency divider, the frequency of the VCO can be varied in minute steps. However, in the fractional frequency divider, spurious components (fractional spurious components), which are unavoidable in principle, occur.

The spurious components are caused by performing frequency division by integers N and N+1 with respect to the frequency division ratio (N+F). Thus, when the local signal includes such spurious components, the frequency differences between the input signal component and the spurious components may coincide with the intermediate frequency band. In this case, the input signal component is converted into the intermediate frequency band, and is thus displayed as a spectrum waveform, thereby performing erroneous measurement.

As a technique of removing the spectrum waveform caused by the fractional spurious components, in the following Japanese Unexamined Patent Application Publication No. 2008-111832, there is disclosed a technique that performs a sweep twice by changing the conditions at the time of the local signal sweep, for example, the frequency division ratio or the time constant of the low-pass filter, specifies the spectrum waveform caused by the fractional spurious components on the basis of the two spectrum waveforms which can be obtained by the sweep, and removes the spectrum waveform.

SUMMARY

As it is, in the above-mentioned document, since the spectrum waveform caused by the fractional spurious components is specified and removed on the basis of the two spectrum waveforms which can be obtained by performing the sweep twice under the changed sweep conditions, at least a time period for performing the sweep twice is necessary to obtain the normal measurement results. Thus, there is a problem in that it is difficult to quickly perform the measurement.

Further, when the spectrum of the input signal changes with the sweep performed twice, it is difficult to specify the spectrum waveform caused by the fractional spurious components. Consequently, in order to obtain a favorable spectrum waveform, more time is necessary.

The invention is addressed to solve the above-mentioned problem, and it is an object of the invention to provide a spectrum analyzer and a spectrum analysis method capable of promptly performing measurement while preventing the spectrum waveform caused by the fractional spurious components from being displayed.

In order to achieve the object, according to an embodiment of the invention, there is provided a spectrum analyzer including:

a frequency conversion section (21) that mixes a local signal subjected to a frequency sweep with an input signal of an analysis target so as to extract a signal component of a predetermined intermediate frequency band from the mixing result;

a local signal generation section (25) that includes a fractional-N PLL synthesizer (26), wherein the PLL synthesizer includes:

a VCO (26a);

a fractional frequency (26b) divider divides a frequency of an output signal of the VCO;

a reference signal generator (26c) outputs a reference signal;

a phase frequency comparator (26d) receives an output of the frequency divider and the reference signal, and outputs a control signal; and, a loop filter (26e) receives a phase error signal and outputs a control signal;

wherein the PLL synthesizer locks the frequency of the output signal of the VCO to a product between a frequency of the reference signal and a frequency division ratio of the frequency divider in response to a control signal;

and wherein the local signal generation section provides the output of the PLL synthesizer or a multiplication output thereof as the local signal to the frequency conversion section, and updates the frequency division ratio of the frequency divider sequentially so as to chronologically output the signal component of the input signal within a designated analysis target frequency range from the frequency conversion section in order of the frequency thereof, thereby sweeping a frequency of the local signal, a signal processing section (30) that performs a band limiting process of a designated resolution bandwidth and an amplitude detection process on the signal output from the frequency conversion section during the frequency sweep of the local signal so as to obtain a spectrum waveform within the analysis target frequency range;

a display section (35) that displays the spectrum waveform which can be obtained by the signal processing section; and an operation section (37) that arbitrarily designates the analysis target frequency range and the resolution bandwidth.

In the spectrum analyzer, a band of the loop filter of the fractional-N PLL synthesizer of the local signal generation section and the frequency of the reference signal are set to be changeable.

The spectrum analyzer is also provided with:

a width determination portion (38) that divides a settable range of the width of the analysis target frequency range into a plurality of regions and determines which region includes the width of the designated analysis target frequency range;

a resolution bandwidth determination portion (39) that divides the settable range of the resolution bandwidth into a plurality of regions and determines which region includes a value of the designated resolution bandwidth; and a setting section (40) that performs a process of setting the frequency of the reference signal, the band of the loop filter, and the frequency division ratio on the basis of the determination results of the width determination portion and the resolution bandwidth determination portion.

In addition, the setting section performs a setting process including:

when the width determination portion determines that the region with the larger width of the plurality of regions includes the width of the designated analysis target frequency range, a first setting mode (S6, S7, S13, and S14 to S20) for setting the frequency of the reference signal to a predetermined reference value, selecting a loop filter band narrower than a set resolution bandwidth so as to thereby make the generation frequencies of fractional spurious components be within the set resolution bandwidth and prevent the generation frequency from being displayed as a spectrum waveform, and setting the frequency division ratio so as to perform a sweep of the designated analysis target frequency range with respect to the reference value; and when the width determination portion determines that the region with the smaller width of the plurality of regions includes the width of the designated analysis target frequency range, a second setting mode (S5, S10, S11, S12, and S20) for shifting the frequency of the reference signal from the reference value by a predetermined value so as to increase the frequency differences between the fractional spurious components and the main signal component of the output signal of the VCO by an amount equal to a product between an integer part of the frequency division ratio and a shift amount thereof, setting the band of the loop filter in accordance with the region including the designated resolution bandwidth in a range narrower than the increased frequency difference so as to suppress levels of the fractional spurious components, and setting the frequency division ratio so as to perform a sweep of the designated analysis target frequency range with respect to the shifted frequency of the reference signal, thereby sweeping the local signal of the local signal generation section under the set conditions.

Further, according to another embodiment of the invention, there is provided a spectrum analysis method using a spectrum analyzer including:

a frequency conversion section (21) that mixes a local signal subjected to a frequency sweep with an input signal of an analysis target so as to extract a signal component of a predetermined intermediate frequency band from the mixing result;

a local signal generation section (25) that includes a fractional-N PLL synthesizer (26), wherein the PLL synthesizer includes:

a VCO (26a);

a fractional frequency (26b) divider divides a frequency of an output signal of the VCO;

a reference signal generator (26c) outputs a reference signal;

a phase frequency comparator (26d) receives an output of the frequency divider and the reference signal, and outputs a control signal; and, a loop filter (26e) receives a phase error signal and outputs a control signal;

wherein the PLL synthesizer locks the frequency of the output signal of the VCO to a product between a frequency of the reference signal and a frequency division ratio of the frequency divider in response to a control signal;

and wherein the local signal generation section provides the output of the PLL synthesizer or a multiplication output thereof as the local signal to the frequency conversion section, and updates the frequency division ratio of the frequency divider sequentially so as to chronologically output the signal component of the input signal within a designated analysis target frequency range from the frequency conversion section in order of the frequency thereof, thereby sweeping a frequency of the local signal, a signal processing section (30) that performs a band limiting process of a designated resolution bandwidth and an amplitude detection process on the signal output from the frequency conversion section during the frequency sweep of the local signal so as to obtain a spectrum waveform within the analysis target frequency range;

a display section (35) that displays the spectrum waveform which can be obtained by the signal processing section; and an operation section (37) that arbitrarily designates the analysis target frequency range and the resolution bandwidth.

In the spectrum analyzer, the spectrum analysis method performs a setting process including a step (S2) of dividing a settable range of a width of the analysis target frequency range into a plurality of regions and determining which region includes the width of the designated analysis target frequency range, a step (S10, S13, or S16) of dividing a settable range of the resolution bandwidth into a plurality of regions and determining which region includes a value of the designated resolution bandwidth, steps (S6, S7, S13, and S14 to S20) of, when it is determined that the region with the larger width of the plurality of regions includes the width of the designated analysis target frequency range, setting the frequency of the reference signal to a predetermined reference value, selecting a loop filter band narrower than a set resolution bandwidth so as to thereby make generation frequencies of fractional spurious components be within the set resolution bandwidth and prevent the generation frequency from being displayed as a spectrum waveform, and setting the frequency division ratio so as to perform a sweep of the designated analysis target frequency range with respect to the reference value, and steps (S5, S10, S11, S12, and S20) of, when it is determined that the region with the smaller width of the plurality of regions includes the width of the designated analysis target frequency range, shifting the frequency of the reference signal from the reference value by a predetermined value so as to increase the frequency differences between the fractional spurious components and a main signal component of the output signal of the VCO by an amount equal to a product between an integer part of the frequency division ratio and a shift amount thereof, setting the band of the loop filter in accordance with the region including the designated resolution bandwidth in a range narrower than the increased frequency difference so as to suppress levels of the fractional spurious components, and setting the frequency division ratio so as to perform a sweep of the designated analysis target frequency range with respect to the shifted frequency of the reference signal, thereby sweeping the local signal of the local signal generation section under the set conditions.

As described above, in the embodiments of the invention, when the width of the designated analysis target frequency range is large, the setting process is performed in a way of setting the frequency of the reference signal to the predetermined reference value, selecting the loop filter band narrower than the set resolution bandwidth so as to thereby make the generation frequencies of the fractional spurious components be within the set resolution bandwidth and prevent the generation frequency from being displayed as the spectrum waveform, and setting the frequency division ratio so as to perform a sweep of the designated analysis target frequency range with respect to the reference value. In contrast, when the width of the designated analysis target frequency range is small, the setting process is performed in a way shifting the frequency of the reference signal from the reference value by the predetermined value so as to increase the frequency differences between the fractional spurious components and the main signal component of the output signal of the VCO by an amount equal to the product between an integer part of the frequency division ratio and the shift amount thereof, setting the band of the loop filter in accordance with the region including the designated resolution bandwidth in the range narrower than the increased frequency difference so as to suppress the levels of the fractional spurious components, and setting the frequency division ratio so as to perform a sweep of the designated analysis target frequency range with respect to the shifted frequency of the reference signal. In such a manner, the local signal of the local signal generation section is swept under the set conditions.

Here, in the spectrum analyzer, the number of data for obtaining one spectrum waveform is defined by, for example, the number of display points of the display section. Thus, from the definition, when the width of the analysis target frequency range is large, the settable value of the resolution bandwidth naturally increases. Accordingly, the unwanted components, of which the frequencies are converted on the basis of the spurious components close to the main signal component of the output signal of the VCO, are covered by the spectrum waveform of the component of the signal of which frequency is converted on the basis of the main signal component, and thus the unwanted components cause no trouble without being observed. Thus, by using the loop filter of the band slightly narrower than the resolution bandwidth, it is possible to observe an accurate spectrum waveform without lowering the speed thereof.

Further, when the width of the analysis target frequency range is small, the settable value of the resolution bandwidth naturally decreases. Thus, it would appear that the unwanted components, of which the frequencies are converted on the basis of the spurious components close to the main signal component of the output signal of the VCO, are separated from the spectrum waveform of the component of the signal of which frequency is converted on the basis of the main signal component, and the unwanted components is observed. However, in the embodiments of the invention, in this case, the frequency of the reference signal is shifted from the reference value by the predetermined value so as to increase the frequency differences between the fractional spurious components and the main signal component of the VCO by the amount equal to the product between the shift amount and the integer part of the frequency division ratio, and simultaneously the band of the loop filter is set in accordance with the region including the designated resolution bandwidth in the range narrower than the increased frequency difference so as to suppress the levels of the fractional spurious components. Consequently, since the loop filter with the wide band corresponding to the amount of the increased frequency difference can be used, it is possible to observe an accurate spectrum waveform without lowering the speed thereof.

DESCRIPTION OF EXEMPLARY EMBODIMENTS

Hereinafter, embodiments of the invention will be described with reference to the accompanying drawings.

Figure 1:
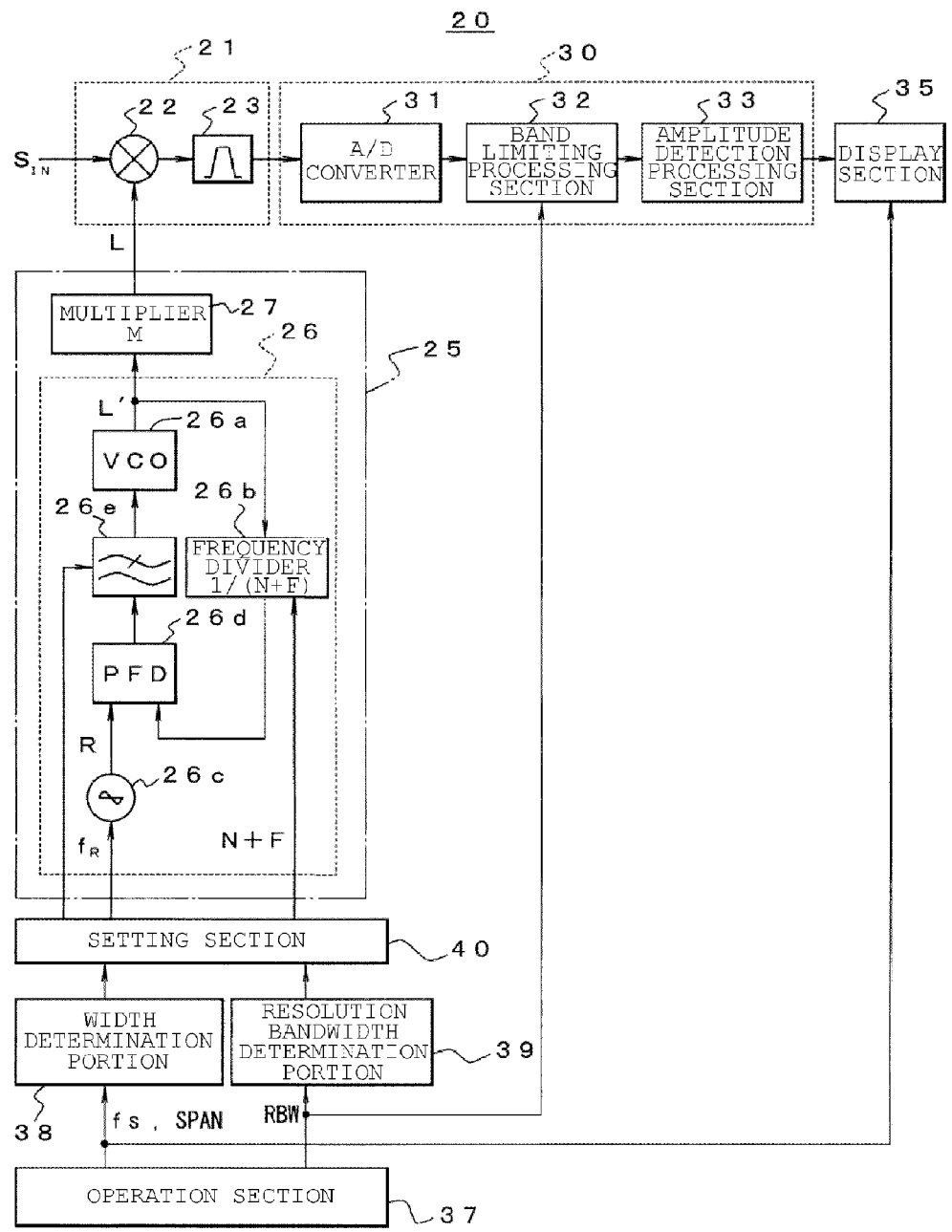
FIG. 1 is a configuration diagram of an embodiment of the invention.

FIG. 1 is a configuration diagram of the entirety of a spectrum analyzer 20 according to an embodiment of the invention.

In FIG. 1, an input signal $S_{IN}$ of the analysis target is input to a frequency conversion section 21. The frequency conversion section 21 mixes an input signal $S_{IN}$ with a local signal L, which is output from a local signal generation section 25 to be described later, through a mixer 22, and inputs the mixing result to a filter 23, thereby extracting a signal component of a predetermined intermediate frequency band. In addition, an example in which the frequency conversion is performed once is herein shown. However, the mixer and filter may be configured to be cascaded, and the frequency conversion process may be performed in the lower frequency band. Here, in this case, the subsequent mixer is provided with a local signal with a fixed frequency. Further, the bandwidth of the filter 23 is set to be equal to or more than the largest width (for example, 10 MHz or the like) in the band limited by a signal processing section 30 to be described later.

The local signal generation section 25 includes the fractional-N PLL synthesizer 26 and a multiplier 27.

The fractional-N PLL synthesizer 26 divides the frequency of the output signal of a VCO (voltage control oscillator) 26a through a fractional frequency divider 26b, inputs the frequency division output and a reference signal R, which is output from a reference signal generator 26c, to a phase frequency comparator (PFD) 26d, and inputs a phase error signal, which is output from the phase frequency comparator 26d, to a loop filter 26e. Then, in response to the control signal output from the loop filter 26e, the fractional-N PLL synthesizer 26 locks a frequency $f_{VCO}$ of the output signal of the VCO 26a to the product between a frequency $f_R$ of the reference signal R and a frequency division ratio (N+F) of the frequency divider 26c.

In addition, here, in order to expand the analysis target frequency range, the local signal L is obtained by multiplying M (M is for example 2, 4, or 8) and the output of the VCO 26a through the multiplier 27. However, by removing the multiplier 27, the output of the VCO 26a may be regarded as the local signal. Further, in order to further expand the analysis target frequency range, it may be possible to adopt a configuration in which the oscillating frequency range is changed by a switch by using a plurality of different VCOs.

Further, the loop filter 26e for determining C/N of the local signal and the response speed of the loop is a low-pass filter, and is thus configured to be able to selectively change the band (the treble cutoff frequency) into any one of, for example, 10 kHz, 25 kHz, 50 kHz, and 300 kHz. Although the loop filter 26e capable of changing the band thereof is herein described, it may be possible to adopt a configuration in which one of plural loop filters having different bands is selected by a switch.

Further, the reference signal generator 26c employs, for example, DDS (direct digital synthesizer), and is configured to be able to slightly change the frequency of the reference signal R from the reference value (for example 50 MHz). In addition, the reference signal generator 26c may employ anything other than the DDS only if it has the same function described above.

The band of the loop filter 26e, the frequency of the reference signal R, and the frequency division ratio (N+F) of the frequency divider 26b are set by a setting section 40. In accordance with the set conditions, the local signal generation section 25 sweeps the frequency of the local signal L by sequentially updating the frequency division ratio of the frequency divider 26b so as to output the signal component of the input signal in the designated analysis target frequency range from the frequency conversion section 21 chronologically in a frequency order.

The output signal of the frequency conversion section 21 is input to the signal processing section 30.

The signal processing section 30 performs sampling on the signals, which are output from the frequency conversion section 21, by using an A/D converter 31 during the frequency sweep of the local signal L so as to sequentially convert the signals into a digital signal sequence, and inputs the signal sequence to a band limiting processing section 32. Then, the signal processing section 30 performs a band limiting process (a digital filtering process) of the designated resolution bandwidth RBW, and also performs an amplitude detection process through an amplitude detection processing section 33, thereby obtaining data of the spectrum waveform of the analysis target frequency range. In addition, although not shown in the drawing, the signal processing section 30 includes a memory for temporarily storing the digital signal sequence and the spectrum waveform data.

The spectrum waveform data which can be obtained by the signal processing section 30 is output to a display section 35, and the spectrum waveform is displayed on a screen of which the horizontal axis represents the frequency thereof and the vertical axis represents the level thereof.

An operation section 37 is for arbitrarily designating various measurement conditions including the analysis target frequency range and the resolution bandwidth. In addition, the analysis target frequency range is designated as a combination of the lower-limit frequency and the upper-limit frequency or a combination of the width (the span) of any of the lower-limit frequency, the upper-limit frequency, and the center frequency.

The designation information of the analysis target frequency range is input to a width determination portion 38. The width determination portion 38 divides the settable range of the width (the span) of the analysis target frequency range into plural regions, and determines which region includes the width of the designated analysis target frequency range.

For example, the maximum analysis target frequency range is set to 0 Hz to 10 GHz, and the settable width is set to 1 Hz to 10 GHz. In this case, the settable range is divided into A1 region: 1 Hz<span≦150 kHz,
A2 region: 150 kHz<span≦500 kHz,
A3 region: 500 kHz<span≦5 MHz,
B1 region: 5 MHz<span≦100 MHz, and
B2 region: 100 MHz<span≦10 GHz.

Then, it is determined which region of A1 to B2 includes the width of the designated analysis target frequency range. In addition, the regions are roughly classified into A regions of 5 MHz or less and B regions of more than 5 MHz, and the setting process changes in accordance with the roughly classified regions.

The boundary between the A regions and the B regions is determined in consideration of the maximum analysis target frequency range (here, 0 to 10 GHz), the frequency variable range of the VCO 26a (here, 2.5 to 5 GHz) corresponding thereto, the multiplication number M of the multiplier 27 (here, 2), and a ratio of the settable value of the resolution bandwidth RBW to the span. Thus, when the frequency range of the VCO 26a is not changed, if the multiplication number M is doubled, that is, becomes 4, the frequency of each region is also doubled. As a result, the boundary value between the A regions and the B regions is doubled in proportion thereto, that is, becomes 10 MHz.

The setting information of the resolution bandwidth RBW is input to a resolution bandwidth determination portion 39. The resolution bandwidth determination portion 39 divides the settable range of the resolution bandwidth into plural regions, and determines which region includes the value of the designated resolution bandwidth.

For example, in the above-mentioned conditions, the settable range of the resolution bandwidth RBW is divided into first region: RBW≦50 kHz,
second region: 300 kHz>RBW≧100 kHz, and
third region: RBW≧300 kHz.

Then, it is determined which region includes the designated resolution bandwidth RBW. Furthermore, in this embodiment, the case where RBW=100 kHz in the second region is also set as one matching conditions.

On the basis of the determination results of the width determination portion 38 and the resolution bandwidth determination portion 39, the setting section 40 performs a process of setting the frequency of the reference signal R of the local signal generation section 25, the loop band, and the frequency division ratio.

Before the setting process is described, the fractional spurious components will be discussed.

As described above, the fractional spurious components are caused by allowing the frequency divider 26b to perform the frequency division by N and N+1 with respect to the frequency division ratio N+F. Thus, it is common knowledge that the fractional spurious components appear at the upper and lower positions separated from the frequency $f_{VCO}$ of the main signal component of the output of the VCO 26a by $$\Delta f_S(P)=P\cdot|f_{VCO}-f_R\cdot N|, \text{ and}$$

$$\Delta f_S(P)'=P\cdot|f_{VCO}-f_N\cdot(N+1)|$$

(P has a value of 1, 2, 3, . . . in accordance with orders of the spurious components). In the embodiment, due to the multiplier 27, the fractional spurious components included in the local signal L become M times the frequency components thereof.

Figure 2:
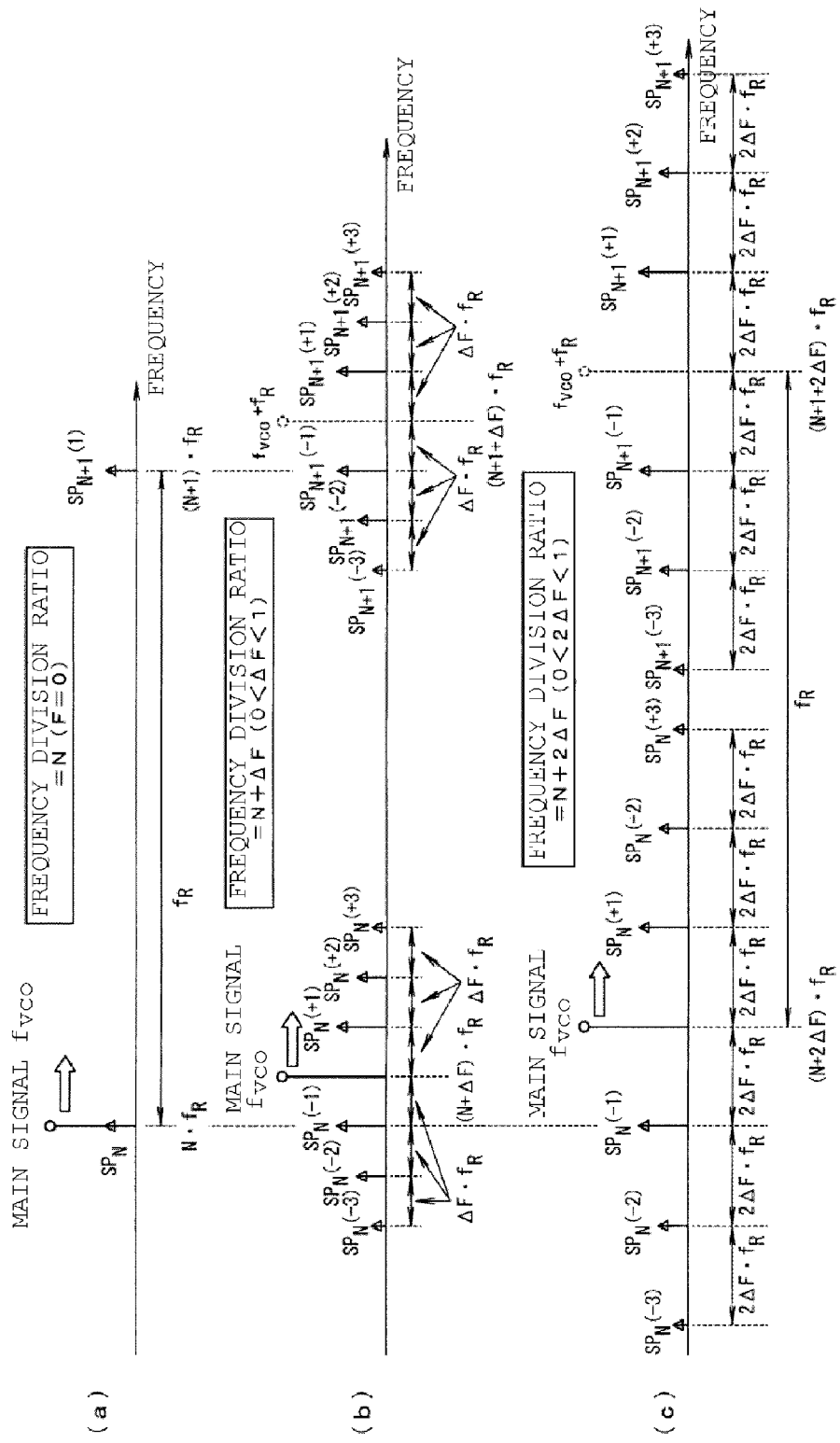
FIGS. 2A, 2B, and 2C are diagrams illustrating a relationship between the local signal and the spurious components.

For example, when F=0, the frequency division ratio=N. In this case, as shown in FIG. 2A, in the output signal of the VCO 26a, the main signal component (indicated by the circle) of the frequency $f_{VCO}$ and the spurious components $SP_N$ of all orders for the integer N are positioned at the frequency $N\cdot f_N$. Thus, the spurious components $SP_{N+1}$ for the integer N+1 are positioned at the frequency $(N+1)\cdot f_R$.

However, the spurious components $SP_N$ of all orders for the integer N coincide with the main signal frequency, and the spurious components $SP_{N+1}$ for the integer N+1 are significantly separated from the main signal by the reference signal frequency or more. Thus, those are suppressed by the loop filter 26e, and do not appear in the PLL output. In other words, when the frequency division ratio=N, the spurious components do not occur. In principle, it may be said that this state is not the fractional frequency division but the simple frequency division by a fixed integer, and thus the spurious components originating from the fractional frequency division do not occur.

Next, when the frequency division ratio is increased by ΔF (0<ΔF<1) in the step of sweeping, as shown in FIG. 2B, the main signal frequency $f_{VCO}$ is shifted to $(N+\Delta F)\cdot f_R$, and the spurious components $SP_N(\pm 1)$, $SP_N(\pm 2)$, $SP_N(\pm 3)$, . . . of respective orders for the integer N appear at positions separated by $\pm\Delta F\cdot f_R$, $\pm 2\Delta F\cdot f_R$, $\pm 3\Delta F\cdot f_R$, . . . from the main signal frequency. Further, at the positions respectively separated by $f_R$ in the positive direction from the spurious components, the respective spurious components $SP_{N+1}(\pm 1)$, $SP_{N+1}(\pm 2)$, $SP_{N+1}(\pm 3)$, . . . for the integer N+1 appear.

Moreover, when the frequency division ratio is set to N+2ΔF (0<2ΔF<1) by increasing the frequency division ratio by 2ΔF, as shown in FIG. 2C, the main signal frequency $f_{VCO}$ is shifted to $(N+2\Delta F)\cdot f_R$, and the spurious components $SP_N(\pm 1)$, $SP_N(\pm 2)$, $SP_N(\pm 3)$, . . . of respective orders for the integer N appear at positions separated by $\pm 2\Delta F\cdot f_R$, $\pm 4\Delta F\cdot f_R$, $\pm 6\Delta F\cdot f_R$, . . . from the main signal frequency. Further, at the positions respectively separated by $f_R$ in the positive direction from the spurious components, the respective spurious components $SP_{N+1}(\pm 1)$, $SP_{N+1}(\pm 2)$, $SP_{N+1}(\pm 3)$, . . . for the integer N+1 appear.

That is to say, as the decimal part F of the frequency division ratio increases, the frequency differences between the main signal and the spurious components for the integer N increase. However, the negative-side spurious components $SP_{N+1}(-1)$, $SP_{N+1}(-2)$, . . . for the integer N+1 approaches to the main signal in accordance with the increase in the decimal part F.

Here, it is assumed that the orders of the spurious components causing problems are 1st to 3rd. Under the assumption, when the negative-side 3rd-order spurious component $SP_{N+1}(-3)$ for the integer N+1 overlaps with the main signal, the following expression is established.

$$N\cdot f_R+\Delta F\cdot f_R=(N+1)f_R-2\Delta F\cdot f_R$$

The expression can be rewritten as $$\Delta F\cdot f_R=f_R/3.$$

Accordingly, when the main signal frequency $f_{VCO}$ reaches $N \cdot f_R + f_R/3$, the main signal overlaps with the 3rd-order spurious component $SP_{N+1}(-3)$.

Likewise, the negative-side 2nd-order spurious component $SP_{N+1}(-2)$ overlaps with the main signal when the frequency $f_{VCO} = N \cdot f_R + f_R/2$, and the negative-side 1st-order spurious component $SP_{N+1}(-1)$ overlaps with the main signal when the frequency $f_{VCO} = N \cdot f_R + f_R$.

Simplistically, focusing on the frequency $f_{VCO}$ of the main signal, the positive-side 1st-order spurious component $SP_{N+1}(1)$ for N, and the negative-side 1st-order spurious component $SP_{N+1}(-1)$ for N+1, when the main signal $f_{VCO}$ is shifted by $f_R$, the main signal overlaps with the spurious component $SP_{N+1}(-1)$, but the positive-side spurious component $SP_N(1)$ for the integer N may be turned over at the frequency $f_R/2$ so as to overlap with the main signal.

Likewise, when the main signal $f_{VCO}$ is shifted by $f_R/2$, the main signal overlaps with the spurious component $SP_{N+1}(-2)$, but the positive-side spurious component $SP_N(2)$ for the integer N may be turned over at the frequency $f_R/2$ so as to overlap with the main signal. Furthermore, when the main signal $f_{VCO}$ is shifted by $f_R/3$, the main signal overlaps with the spurious component $SP_{N+1}(-3)$, but the positive-side spurious component $SP_N(3)$ for the integer N may be turned over at the frequency $f_R/2$ so as to overlap with the main signal.

Here, since the spurious components causing problems are present near the main signal, the spurious components sufficiently separated from the loop band are suppressed. That is, when the frequency difference between the main signal and the spurious component closest thereto is within the loop band, if the value obtained by multiplying the frequency difference by the multiplication number M exceeds the resolution bandwidth RBW, unwanted spectrum in which the frequency is converted on the basis of the multiplied spurious component is displayed.

In order to prevent the unwanted spectrum from being displayed, the spectrum analyzer 20 is configured so as to be able to change the band of the loop filter 26e and the frequency of the reference signal. With such a configuration, in accordance with the relationship between the magnitude of the width (span) of the analysis target frequency range and the resolution bandwidth RBW, the spectrum analyzer 20 distinctively uses the function of suppressing the spurious component by restricting the band of the loop filter 26e and the function of increasing the frequency difference between the main signal and the spurious component by shifting the reference frequency.

Specifically, the frequencies of the spurious components based on the integer N and N+1 may be very close to the frequency of the main signal (for example, by 1 kHz or less), and the frequency differences may be larger than the resolution bandwidth RBW. In this case, by providing the loop band narrower than the frequencies, it is possible to suppress the spurious components, but thereby it takes a long time to lock the frequencies, and thus the response speed becomes extremely low. As a result, it is difficult to promptly obtain the measurement result. However, in such a case, by increasing the frequency differences between the main signal component and the spurious components, the spurious components are suppressed with the loop band set to be wide enough that the local signal is swept.

Further, even when the frequency differences are small, the designated resolution bandwidth RBW may be sufficiently larger than the frequency differences. In this case, the signal spectrum, in which frequencies are converted on the basis of the spurious components, is covered by the spectrum in which the frequency is converted on the basis of the main signal component. In such a manner, a high-speed sweep is achieved.

Each frequency difference between each spurious component and the main signal depends in a large part on the resolution bandwidth RBW and the width (span) of the analysis target frequency range designated by a user.

That is, when the span is large, an amount of change in frequency (corresponding to ΔF mentioned above) per individual step at the time of the sweep increases, and thus the frequency difference between the spurious component and the main signal component of the VCO increases. However, the settable resolution bandwidth RBW also necessarily increases. Here, the spurious components out of the loop band can be suppressed by the filter therefor. Further, regarding the spurious components within the loop band, by using the point where the resolution bandwidth RBW is large, the unwanted components, of which the frequencies are converted on the basis of the spurious components close to the main signal component, are covered by the spectrum waveform of the component of the signal, of which frequency is converted on the basis of the main signal component, so as not to be observed. Thus, by using the loop filter of the band slightly narrower than the resolution bandwidth, it is possible to observe an accurate spectrum waveform without lowering the speed thereof.

That is, when the span is small, the amount of change in frequency (corresponding to ΔF mentioned above) per individual step decreases. However, since the resolution bandwidth RBW also necessarily decreases, it can be observed that the unwanted components, of which the frequencies are converted on the basis of the spurious components close to the main signal component of the local signal, are separated from the spectrum waveform of the component of the signal, of which frequency is converted on the basis of the main signal. However, in this case, in the spectrum analyzer 20 according to the embodiment, the frequency of the reference signal R is shifted from the reference value by the predetermined value so as to increase the frequency differences between the fractional spurious components and the main signal component of the VCO by the amount equal to the product between the shift amount and the integer part of the frequency division ratio, and simultaneously the band of the loop filter is set in accordance with the region including the designated resolution bandwidth in the range narrower than the increased frequency difference so as to suppress the levels of the fractional spurious components. Consequently, since the loop filter with the wide band corresponding to the amount of the increased frequency difference can be used, it is possible to observe an accurate spectrum waveform without lowering the speed thereof.

Here, as described above, the relationship between the shift amount of the reference signal and the frequency difference is represented as the following expression.

$$\Delta f_S(P) = P \cdot |f_{VCO} - f_R \cdot N|$$

Accordingly, when the frequency of the reference signal is shifted from the reference value $f_R$ to $f_R - \Delta fr$, the frequency of the spurious component increases by N·fr. For example, when N=25 and the shift amount Δfr is for example 1 MHz, the spurious component can be separated by 25 MHz from the main signal. However, in this case, it is also necessary to change the frequency division ratio N+F in accordance with the shifted frequency of the reference signal.

The above-mentioned setting section 40 performs, on the basis the span or the value of the resolution bandwidth RBW, the process of setting the frequency of the reference signal R of the local signal generation section 25, the band of the loop filter 26e, and the frequency division ratio so as not to display the unnecessary spectrum caused by the fractional spurious components while lowering the response speed of the loop as little as possible.

Figure 3:
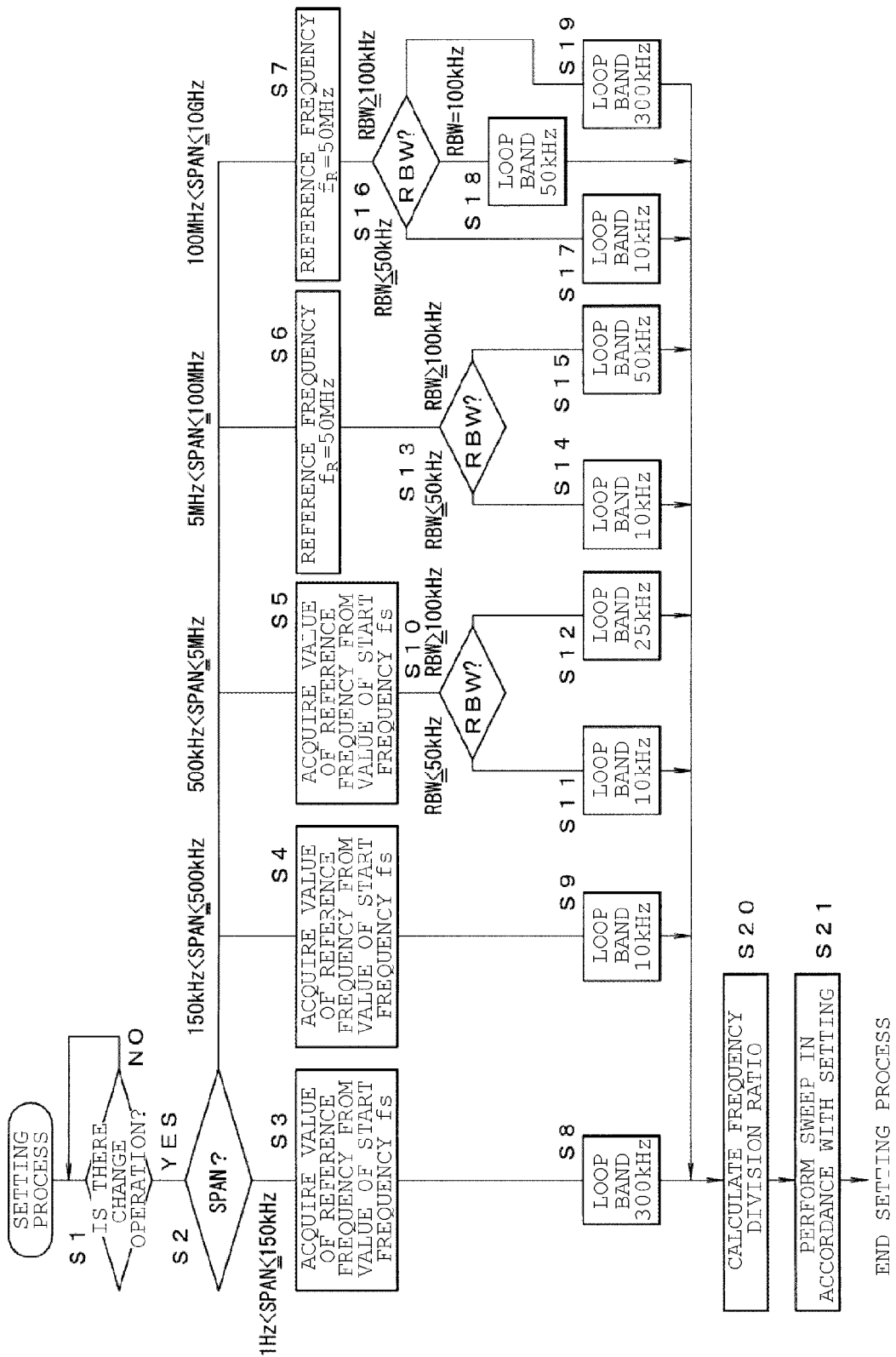
FIG. 3 is a flowchart illustrating operations of the embodiment.
Figure 4:
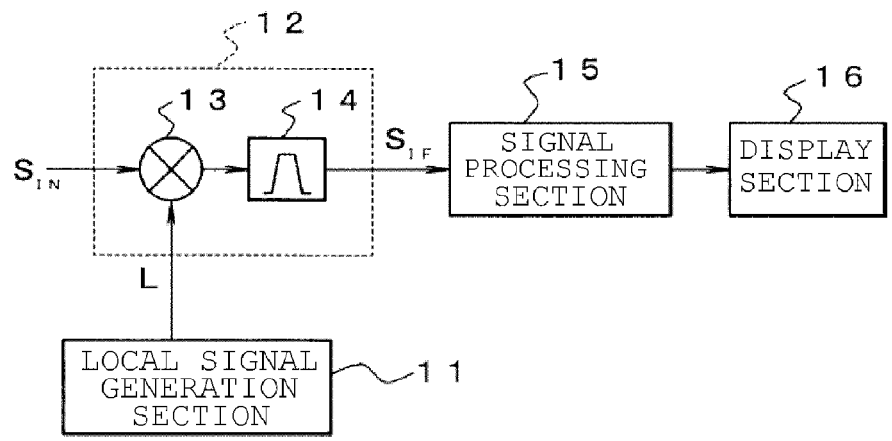
FIG. 4 is a basic configuration diagram of a spectrum analyzer.
Figure 5:
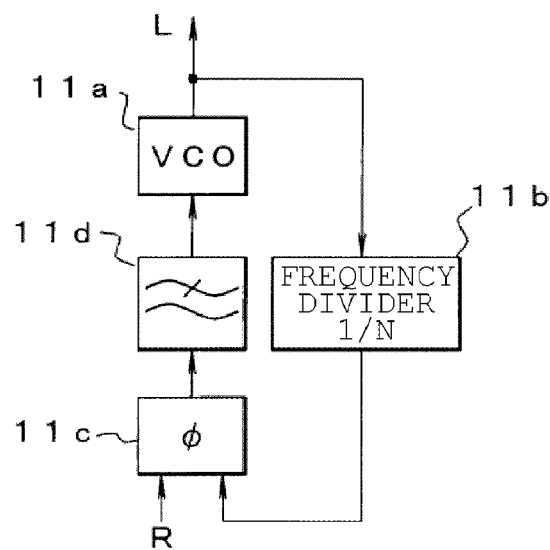
FIG. 5 is a configuration diagram of a PLL synthesizer.

FIG. 3 is a flowchart illustrating exemplary operations of the width determination portion 38, the resolution bandwidth determination portion 39, and the setting section 40.

Hereinafter, the operations of the spectrum analyzer 20 according to the embodiment will be described with reference to the flowchart.

First, when the analysis target frequency range or the resolution bandwidth RBW is designated to be changed through the operation section 37 (S1), it is determined which of the divided regions includes the designated span (S2).

Here, if the span is in the A1 to A3 regions of 5 MHz or less, the designated resolution bandwidth RBW also decreases. Thus, it is determined that the frequency difference between the fractional spurious component and the main signal component of the output signal of the VCO 26a decreases. Then, in order to increase the frequency difference, the frequency of the reference signal R shifted from the reference value $f_R$ by a necessary amount is calculated (S3 to S5).

Further, if the span is in the B1 and B2 regions of more than 5 MHz, it is determined that the designated resolution bandwidth RBW is also large and the frequency difference between the fractional spurious component and the main signal component can be sufficiently secured. Then, the frequency of the reference signal R is set as the reference value (50 MHz) (S6, S7).

Moreover, in accordance with the designated span, the band of the loop filter 26e is more minutely set.

Specifically, if the span is in the smallest A1 region (S3), the spurious component corresponding to the increased frequency difference becomes outside the display range (that is, the span) of the frequency axis of the spectrum waveform, and thus need not be suppressed. Accordingly, in this case, noise in the PLL band is compressed by using the wide loop band of 300 kHz, thereby improving C/N (S8).

Further, if the span is in the A2 region (S4), the increased frequency difference is sufficiently suppressed by a narrow loop filter. Therefore, in the region, the narrowest loop band of 10 kHz is selected (S9).

Further, if the span is in the A3 region (S5), the increased frequency difference range is also increases. Therefore, it is necessary to select an optimal loop band in accordance with the resolution bandwidth RBW.

Accordingly, the determination result of the resolution bandwidth RBW is checked (S10). On the basis of the result, if the resolution bandwidth RBW is 50 kHz or less, with suppressing of the spurious component given priority, the narrowest loop band of 10 kHz is selected (S11). In contrast, if the resolution bandwidth RBW is 100 kHz or more (or exceeds 50 kHz), the ratio of the resolution bandwidth RBW to the span is large, and the spectrum component, of which the frequency is converted on the basis of the spurious component, is covered by the spectrum component of which the frequency is converted on the basis of the main signal. Therefore, with speed given priority, the slightly wide loop band of 25 kHz is selected (S12).

Further, if the span is in the B1 region of more than 5 MHz (S6), in order to use the reference signal as it is, the fractional spurious component appear in the vicinity thereof. Hence, in order for the fractional spurious component not to appear in the spectrum waveform, it is necessary to select an optimal loop band in accordance with the resolution bandwidth RBW.

Accordingly, the determination result of the resolution bandwidth RBW is checked (S13). On the basis of the result, if the resolution bandwidth RBW is 50 kHz or less, with suppressing of the spurious component given priority, the narrowest loop band of 10 kHz is selected (S14). In contrast, if the resolution bandwidth RBW is 100 kHz or more (or exceeds 50 kHz), the ratio of the resolution bandwidth RBW to the span is large, and the spectrum component based on the spurious component is covered by the spectrum component based on the main signal. Therefore, with speed given priority, the wider loop band of 50 kHz is selected (S15).

Further, if the span is in the even larger B2 region (S7), in order to use the reference signal as it is, the fractional spurious component appear in the vicinity thereof. Hence, in order for the fractional spurious component not to appear in the spectrum waveform, it is also necessary to select an optimal loop band in accordance with the resolution bandwidth RBW.

Accordingly, the determination result of the resolution bandwidth RBW is checked (S16). On the basis of the result, if the resolution bandwidth RBW is 50 kHz or less (in a real situation, 10 kHz), the loop band of 10 kHz is selected (S17). If the resolution bandwidth RBW is 100 kHz, the loop band of 50 kHz is selected (S18). If the resolution bandwidth RBW is more than 100 kHz, the wider loop band of 300 kHz is selected in order for the speed to have priority (S19).

As described above, on the basis of the designated span and the resolution bandwidth RBW, the reference frequency and the loop band is determined. Thereafter, the frequency division ratio N+F capable of obtaining the signal spectrum of the designated analysis target frequency range with respect to the reference frequency is calculated (S20). Then, such information is set in the local signal generation section 25, and a sweep is started (S21).

As described above, in the spectrum analyzer 20 according to the embodiment, in the case of the B1 and B2 regions in which the width of the designated analysis target frequency range is larger than the boundary value, the designated resolution bandwidth also naturally increases. Accordingly, the unwanted components, of which the frequencies are converted on the basis of the spurious components close to the main signal component of the output signal of the VCO, are covered by the spectrum waveform of the component of the signal of which frequency is converted on the basis of the main signal component, and thus the unwanted components cause no trouble and are not observed. Therefore, by selecting the loop filter of the band slightly narrower than the resolution bandwidth by that amount, it is possible to observe an accurate spectrum waveform without lowering the speed thereof.

Further, in the A3 region in which the width of the analysis target frequency range is small, the resolution bandwidth may be comparatively small. In this case, it would appear that the unwanted components, of which the frequencies are converted on the basis of the spurious components close to the main signal component of the output signal of the VCO, are separated from the spectrum waveform of the component of the signal of which frequency is converted on the basis of the main signal component, and the unwanted components are observed. However, in this case, the frequency of the reference signal is shifted from the reference value by the predetermined value so as to increase the frequency differences between the fractional spurious components and the main signal component of the output signal of the VCO by the amount equal to the product between the shift amount and the integer part of the frequency division ratio, and simultaneously the band of the loop filter is set in accordance with the region including the designated resolution bandwidth in the range narrower than the increased frequency difference so as to suppress the levels of the fractional spurious components. Consequently, since the loop filter with the wide band corresponding to the amount of the increased frequency difference can be used, it is possible to observe an accurate spectrum waveform without lowering the speed thereof.

In addition, the above-mentioned range of each frequency region is one example of the reference for changing the modes of the setting process. Accordingly, when the region of the analysis target frequency is shifted into the lower frequency band, it is necessary to also lower the boundary frequency of the region. Further, the ranges of the frequency regions may be changed in accordance with the case where the multiplier is not used or the case where higher-order multiplication is performed.

What is claimed is:

1. A spectrum analyzer comprising:
a frequency conversion section that mixes a local signal subjected to a frequency sweep with an input signal of an analysis target so as to extract a signal component of a predetermined intermediate frequency band from the mixing result;
a local signal generation section that includes a fractional-N PLL synthesizer, wherein the PLL synthesizer includes:
a VCO;
a fractional frequency divider divides a frequency of an output signal of the VCO;
a reference signal generator outputs a reference signal;
a phase frequency comparator receives an output of the frequency divider and the reference signal, and outputs a phase error signal; and,
a loop filter receives the phase error signal and outputs a control signal;
wherein the PLL synthesizer locks the frequency of the output signal of the VCO to a product between a frequency of the reference signal and a frequency division ratio of the frequency divider in response to a control signal;
and wherein the local signal generation section provides the output of the PLL synthesizer or a multiplication output thereof as the local signal to the frequency conversion section, and updates the frequency division ratio of the frequency divider sequentially so as to chronologically output the signal component of the input signal within a designated analysis target frequency range from the frequency conversion section in order of the frequency thereof, thereby sweeping a frequency of the local signal,
a signal processing section that performs a band limiting process of a designated resolution bandwidth and an amplitude detection process on the signal output from the frequency conversion section during the frequency sweep of the local signal so as to obtain a spectrum waveform within the analysis target frequency range;
a display section that displays the spectrum waveform which can be obtained by the signal processing section; and
an operation section that arbitrarily designates the analysis target frequency range and the resolution bandwidth,
wherein a band of the loop filter of the fractional-N PLL synthesizer of the local signal generation section and the frequency of the reference signal are set to be changeable,
wherein the spectrum analyzer is provided with
a width determination portion that divides a settable range of a width of the analysis target frequency range into a plurality of regions and determines which region includes the width of the designated analysis target frequency range,
a resolution bandwidth determination portion that divides a settable range of the resolution bandwidth into a plurality of regions and determines which region includes a value of the designated resolution bandwidth, and
a setting section that performs a process of setting the frequency of the reference signal, the band of the loop filter, and the frequency division ratio on the basis of the determination results of the width determination portion and the resolution bandwidth determination portion,
wherein the setting section performs a setting process including,
when the width determination portion determines that a region with the larger width of the plurality of regions includes the width of the designated analysis target frequency range, a first setting mode for setting the frequency of the reference signal to a predetermined reference value, selecting a loop filter band narrower than a set resolution bandwidth so as to thereby make generation frequencies of fractional spurious components be within the set resolution bandwidth and prevent the generation frequency from being displayed as a spectrum waveform, and setting the frequency division ratio so as to perform a sweep of the designated analysis target frequency range with respect to the reference value, and
when the width determination portion determines that the region with the smaller width of the plurality of regions includes the width of the designated analysis target frequency range, a second setting mode for shifting the frequency of the reference signal from the reference value by a predetermined value so as to increase a frequency differences between the fractional spurious components and a main signal component of the output signal of the VCO by an amount equal to a product between an integer part of the frequency division ratio and a shift amount thereof, setting the band of the loop filter in accordance with the region including the designated resolution bandwidth in a range narrower than the increased frequency difference so as to suppress levels of the fractional spurious components, and setting the frequency division ratio so as to perform a sweep of the designated analysis target frequency range with respect to the shifted frequency of the reference signal,
thereby sweeping the local signal of the local signal generation section under the set conditions.

2. A spectrum analysis method using a spectrum analyzer, comprising the steps of
mixing, by a frequency conversion section of the spectrum analyzer, a local signal subjected to a frequency sweep with an input signal of an analysis target so as to extract a signal component of a predetermined intermediate frequency band from the mixing result, the spectrum analyzer further comprising a local signal generation section that includes a fractional-N PLL synthesizer, wherein the PLL synthesizer comprises a VCO, a fractional frequency divider that divides a frequency of an output signal of the VCO, a reference signal generator that outputs a reference signal, a phase frequency comparator that receives an output of the frequency divider and the reference signal and outputs a phase error signal, and a loop filter that receives the phase error signal and outputs a control signal;

locking, by the PLL synthesizer, the frequency of the output signal of the VCO to a product between a frequency of the reference signal and a frequency division ratio of the frequency divider in response to a control signal;

providing, by the local signal generation section, the output of the PLL synthesizer or a multiplication output thereof as the local signal to the frequency conversion section, and updating the frequency division ratio of the frequency divider sequentially so as to chronologically output the signal component of the input signal within a designated analysis target frequency range from the frequency conversion section in order of the frequency thereof, thereby sweeping a frequency of the local signal, performing, by a signal processing section of the spectrum analyzer, a band limiting process of a designated resolution bandwidth and an amplitude detection process on the signal output from the frequency conversion section during the frequency sweep of the local signal so as to obtain a spectrum waveform within the analysis target frequency range, displaying, by a display section of the spectrum analyzer, the spectrum waveform which can be obtained by the signal processing section, and arbitrarily designating, by an operation section of the spectrum analyzer, the analysis target frequency range and the resolution bandwidth wherein the spectrum analysis method performs a setting process including the steps of dividing a settable range of a width of the analysis target frequency range into a plurality of regions and determining which region includes the width of the designated analysis target frequency range, dividing a settable range of the resolution bandwidth into a plurality of regions and determining which region includes a value of the designated resolution bandwidth, when it is determined that a region with the larger width of the plurality of regions includes the width of the designated analysis target frequency range, setting the frequency of the reference signal to a predetermined reference value, selecting a loop filter band narrower than a set resolution bandwidth so as to thereby make generation frequencies of fractional spurious components be within the set resolution bandwidth and prevent the generation frequency from being displayed as a spectrum waveform, and setting the frequency division ratio so as to perform a sweep of the designated analysis target frequency range with respect to the reference value, and when it is determined that the region with the smaller width of the plurality of regions includes the width of the designated analysis target frequency range, shifting the frequency of the reference signal from the reference value by a predetermined value so as to increase a frequency differences between the fractional spurious components and a main signal component of the output signal of the VCO by an amount equal to a product between an integer part of the frequency division ratio and a shift amount thereof, setting the band of the loop filter in accordance with the region including the designated resolution bandwidth in a range narrower than the increased frequency difference so as to suppress levels of the fractional spurious components, and setting the frequency division ratio so as to perform a sweep of the designated analysis target frequency range with respect to the shifted frequency of the reference signal, thereby sweeping the local signal of the local signal generation section under the set conditions.

* * * * *